(12) United States Patent
Lee et al.

(10) Patent No.: US 12,389,779 B2
(45) Date of Patent: Aug. 12, 2025

(54) DISPLAY DEVICE WITH IMPROVED TOUCH RECOGNITION CAPABILITIES

(71) Applicant: LG Display Co., Ltd, Seoul (KR)

(72) Inventors: MiRae Lee, Gyeonggi-do (KR); Minsuk Kong, Gyeonggi-do (KR); YoungJun Jeon, Gyeonggi-do (KR); Youngjin Choe, Gyeonggi-do (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/544,641

(22) Filed: Dec. 19, 2023

(65) Prior Publication Data

US 2024/0224701 A1 Jul. 4, 2024

(30) Foreign Application Priority Data

Dec. 30, 2022 (KR) .......................... 10-2022-0191133

(51) Int. Cl.
*G06F 3/041* (2006.01)
*G06F 3/044* (2006.01)
*H10K 59/121* (2023.01)
*H10K 59/126* (2023.01)
*H10K 59/131* (2023.01)
*H10K 59/40* (2023.01)

(52) U.S. Cl.
CPC ........... *H10K 59/40* (2023.02); *G06F 3/0445* (2019.05); *H10K 59/1213* (2023.02); *H10K 59/126* (2023.02); *H10K 59/131* (2023.02); *G06F 2203/04107* (2013.01)

(58) Field of Classification Search
CPC .. H10K 59/40; H10K 59/131; H10K 59/1213; H10K 59/126; G06F 3/0445; G06F 2203/04107
See application file for complete search history.

(56) References Cited

U.S. PATENT DOCUMENTS

2012/0081328 A1\* 4/2012 Kandziora ............ G06F 3/0446
327/552
2014/0001018 A1\* 1/2014 Lee .......................... H01H 1/06
200/275

(Continued)

FOREIGN PATENT DOCUMENTS

KR 20190081756 A 7/2019

*Primary Examiner* — Roy P Rabindranath
(74) *Attorney, Agent, or Firm* — Fish & Richardson P.C.

(57) ABSTRACT

The disclosure relates to a display device. In an embodiment, a display device includes a lower substrate including a plurality of sub pixels forming an active area and a non-active area enclosing the active area; a thin film transistor on the lower substrate corresponding to one of the plurality of sub pixels; a light emitting diode on the thin film transistor corresponding to the one of the plurality of sub pixels; a plurality of first touch electrodes on the light emitting diode corresponding to the active area; a plurality of second touch electrodes on the plurality of first touch electrodes corresponding to the active area; a first shielding electrode between the light emitting diode and the plurality of first touch electrodes overlapping a first touch electrode; and a second shielding electrode between the light emitting diode and the plurality of first touch electrodes, wherein the second shielding electrode does not overlap the first touch electrode.

18 Claims, 9 Drawing Sheets

(56) References Cited

U.S. PATENT DOCUMENTS

| | | | |
|---|---|---|---|
| 2014/0253829 A1* | 9/2014 | Kim | G06F 3/047 |
| | | | 349/12 |
| 2020/0004368 A1* | 1/2020 | Kim | G06F 3/04164 |
| 2021/0103354 A1* | 4/2021 | Kim | G06F 1/1643 |
| 2021/0405810 A1* | 12/2021 | Chen | G06F 3/04164 |
| 2022/0357816 A1* | 11/2022 | Wen | G09G 3/035 |
| 2023/0017345 A1* | 1/2023 | Fujisawa | G06F 3/044 |
| 2024/0206297 A1* | 6/2024 | Lee | H10K 50/80 |

* cited by examiner

DISPLAY DEVICE WITH IMPROVED TOUCH RECOGNITION CAPABILITIES

CROSS-REFERENCE TO RELATED APPLICATIONS

This application claims the priority of Korean Patent Application No. 10-2022-0191133 filed on Dec. 30, 2022, in the Korean Intellectual Property Office, the entire disclosure of which is incorporated herein by reference.

BACKGROUND

Field of Disclosure

The present disclosure relates to a display device, and more particularly, to a display device which reduces an interference between a thin film transistor and a touch electrode.

Description of Related Art

In recent years, various display devices that can visually express electrical information signals have been rapidly developed, and in response to this, various display devices having excellent performances such as thin-thickness, light weight, and low power consumption have been developed. Specific examples of such a display device include a liquid crystal display (LCD) device, a plasma display panel (PDP) device, a field emission display (FED) device, and an organic light emitting display (OLED) device.

To provide more functionalities to users, such a display device provides a function of recognizing a touch on a display panel of a user and performing input processing based on the recognized touch.

A display device which is capable of recognizing a touch includes a plurality of touch electrodes which is disposed or embedded in the display panel and drives the touch electrode to detect the presence of the touch of the user on the display panel and a touch coordinate.

SUMMARY

One non-limiting objective of the present disclosure is to provide a display device which reduces a noise of a touch signal due to a signal interference between a thin film transistor and a touch electrode of a display panel.

Another non-limiting objective of the present disclosure is to provide a display device which suppresses visible recognition of a pattern shape of a touch electrode.

Still another non-limiting objective of the present disclosure is to reduce the resistance of a touch routing line disposed in a non-active area to implement stable driving of the touch panel and reduction of RC delay.

Objective of the present disclosure are not limited to the above-mentioned objects, and other objectives, which are not mentioned above, may be clearly understood by those skilled in the art from the following descriptions.

In one aspect, a display device includes a lower substrate including a plurality of sub pixels and including an active area and a non-active area which encloses the active area: a thin film transistor on the lower substrate corresponding to one of the plurality of sub pixels: a light emitting diode on the thin film transistor corresponding to the one of the plurality of sub pixels: a plurality of first touch electrodes on the light emitting diode corresponding to the active area: a plurality of second touch electrodes on the plurality of first touch electrodes corresponding to the active area: a first shielding electrode between the light emitting diode and the plurality of first touch electrodes overlapping a first touch electrode of the plurality of first touch electrodes: and a second shielding electrode between the light emitting diode and the plurality of first touch electrodes, wherein the second shielding electrode does not overlap the first touch electrode.

In another aspect, the first shielding electrode and the second shielding electrode vertically overlap the thin film transistor.

In another aspect, the second shielding electrode overlaps one of the plurality of second touch electrodes.

In another aspect, each of the plurality of first touch electrodes has a mesh pattern including a plurality of openings.

In another aspect, each of the plurality of first touch electrodes includes a plurality of first metal lines extending in a first direction and a plurality of second metal lines extending in a second direction which is different from the first direction, the plurality of first metal lines and the plurality of second metal lines are connected to each other to form the plurality of openings, each of the plurality of openings corresponding to emission areas of one or more sub pixels, and the plurality of first metal lines and the plurality of second metal lines correspond to non-emission areas of one or more sub pixels.

In another aspect, the second shielding electrode is disposed in a non-emission area located within one pixel distance from the first shielding electrode.

In another aspect, the first shielding electrode includes a first shielding metal line and a second shielding metal line disposed so as to overlap the first metal line and the second metal line, and the second shielding electrode includes an area which extends from the first shielding metal line to the second direction by one pixel distance, and an area which is spaced apart from the first shielding metal line by one pixel distance to extend in the first direction.

In another aspect, the one pixel distance is a size of one sub pixel to a size of three sub pixels.

In another aspect, the display device further includes a third shielding electrode in a dummy area that does not overlap the first shielding electrode and the second shielding electrode, the dummy area being a non-emission area.

In another aspect, the third shielding electrode is randomly disposed in the dummy area.

In another aspect, a width of the first shielding electrode is larger than a width of the first touch electrode.

In another aspect, a width of the second shielding electrode is smaller than a width of the first touch electrode.

In another aspect, the third shielding electrode has partially varying width.

In another aspect, the display device further includes one or more first touch routing lines in the non-active area connected to each of a plurality of first touch electrode lines: one or more second touch routing lines connected to each of a plurality of second touch electrode lines: and one or more shielding routing lines connected to the first shielding electrode and the second shielding electrode, wherein the first touch routing line, the second touch routing line, and the shielding routing line have triple wiring patterns.

In another aspect, each of the first touch routing line, the second touch routing line, and the shielding routing line includes a first electrode layer formed on the same layer as the first shielding electrode and the second shielding electrode, a second electrode layer formed on the same layer as the first touch electrode, and a third electrode layer formed on the same layer as the second touch electrode, and the first electrode layer, the second electrode layer, and the third electrode layer are electrically connected to each other through a contact hole formed in an insulating layer.

In another aspect, the first touch routing line and the second touch routing line are connected to a touch pad disposed in the non-active area and at least one of the first electrode layer, the second electrode layer, and the third electrode layer is in contact with the touch pad.

In another aspect, the first touch routing line and the second touch routing line extend toward the touch pad and are adjacent to the touch pad to include only any one of the first electrode layer, the second electrode layer, and the third electrode layer.

In one aspect, a display device includes a substrate including a plurality of sub pixels forming an active area and a non-active area enclosing the active area: a thin film transistor on the substrate: a light emitting diode on the thin film transistor: a plurality of first touch electrodes on the light emitting diode: a first shielding electrode overlapping at least one of the plurality of first touch electrodes: and a second shielding electrode not overlapping the at least one of the plurality of first touch electrodes.

In another aspect, the display device further includes a plurality of second touch electrodes, wherein the second shielding electrode overlaps at least one of the plurality of second touch electrodes.

In another aspect, the plurality of first touch electrodes and the plurality of second touch electrodes correspond to the active area.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
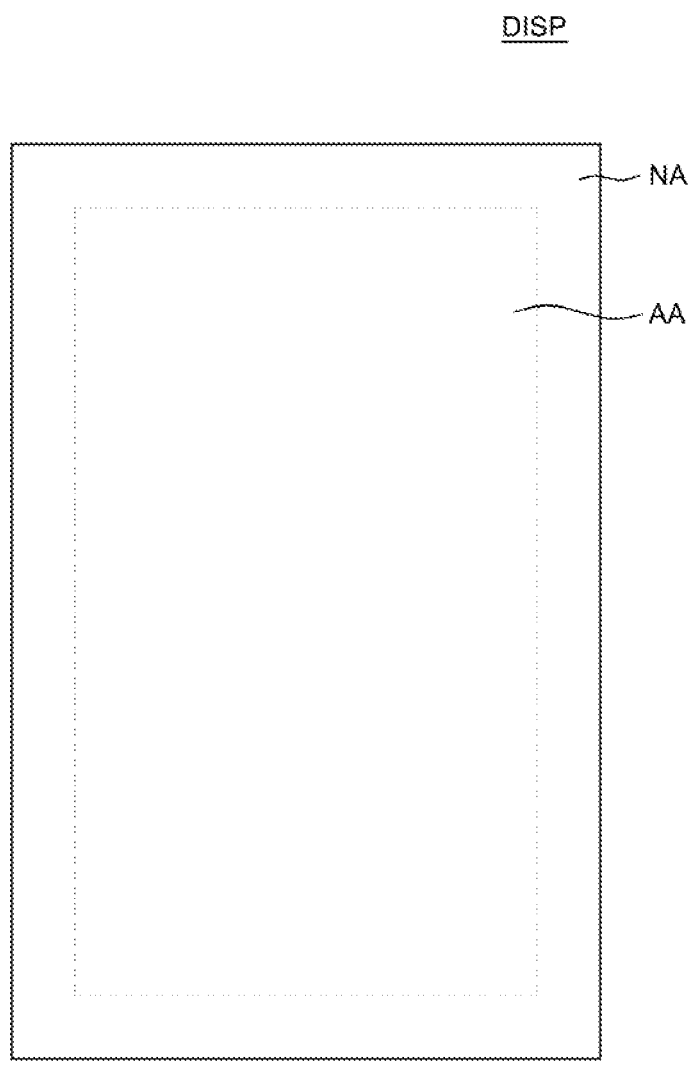
FIG. 1 is a schematic plan view for explaining a display panel of a display device according to an exemplary aspect of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure may be partially or entirely adhered to or combined with each other and may be interlocked and operated in technically various ways, and the embodiments may be carried out independently of or in association with each other.

Hereinafter, a display device according to exemplary embodiments of the present disclosure will be described in detail with reference to accompanying drawings.

Figure 2:
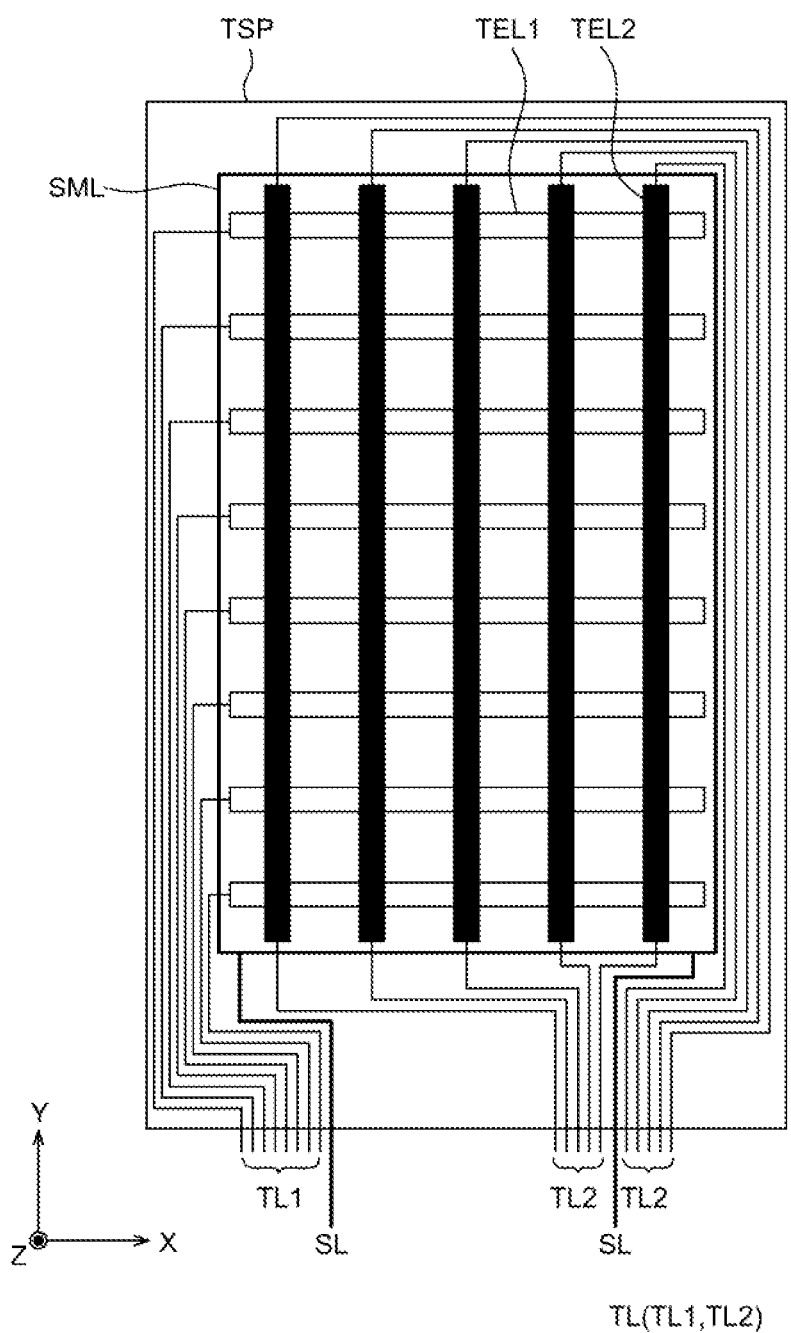
FIG. 2 is a schematic plan view for explaining a touch panel of a display device according to an exemplary aspect of the present disclosure.

FIGS. 1 and 2 are views for explaining a display device according to an exemplary aspect of the present disclosure. FIG. 1 is a schematic plan view for explaining a display panel of a display device according to an exemplary aspect of the present disclosure: FIG. 2 is a schematic plan view for explaining a touch panel of a display device according to an exemplary aspect of the present disclosure.

Referring to FIG. 1, a display device 100 includes a display panel DISP.

The display panel DISP includes a substrate using glass or plastic and a plurality of gate lines and a plurality of data lines disposed on the substrate to intersect each other. A plurality of pixels is defined at intersections of the plurality of gate lines and data lines. An area in which a plurality of pixels implementing images is disposed is referred to as an active area AA and an area disposed at the outside of the active area AA in which the plurality of pixels is not disposed is referred to as a non-active area NA.

In the active area AA, a display unit for displaying images and a circuit unit for driving the display unit may be disposed. For example, when the display device 100 is an organic light emitting display device, the display unit may include a light emitting diode. The display unit may include an anode, an organic light emitting layer on the anode, and a cathode on the organic light emitting layer. For example, the organic light emitting layer may be configured by a hole transport layer, a hole injection layer, an organic emission layer, an electron injection layer, and an electron transport layer. However, when the display device 100 is a liquid crystal display device, the display unit may be configured to include a liquid crystal layer. However, when the display device 100 is a quantum dot display device, the display unit may be configured to include an emission area including quantum dots. Hereinafter, for the convenience of description, it is assumed that the display device 100 is an organic light emitting display device, but is not limited thereto.

The circuit unit may include various thin film transistors, capacitors, and wiring lines for driving the light emitting diode. For example, the circuit unit may be configured by various components such as a driving transistor, a switching transistor, a storage capacitor, a gate line, and a data line, but is not limited thereto.

The non-active area NA is an area where no image is displayed and various wiring lines and circuits for driving the display unit disposed in the active area AA are disposed.

The non-active area NA may be defined as an area which encloses the active area AA as illustrated in FIG. 1, but it is not limited thereto and the non-active area NA may be defined as an area extending from the active area AA. Further, the non-active area NA may be defined to extend from a plurality of sides of the active area AA.

In the non-active area NA, a COF or an FPCB in which various ICs such as a gate driver IC and a data driver IC and driving circuits are disposed may be disposed. Further, in the non-active area NA, a driving circuit referred to as a gate in panel (GIP) may be disposed.

Referring to FIG. 2, a display device 100 includes a touch panel TSP. The touch panel TSP senses a touch input of a user. Specifically, the touch panel TSP is referred to as a touch sensing unit.

The touch panel TSP may be manufactured separately from the display panel DISP to be attached onto the display panel DISP as an add-on type or may be embedded in the display panel DISP as an in-cell type.

Specifically, when the touch panel TSP is separately manufactured from the display panel DISP to be attached onto the display panel DISP as an add-on type, the touch panel TSP may be attached to the display panel DISP by means of an adhesive layer. A structure in which the touch panel TSP is attached onto the display panel DISP as an add-on type will be described in detail below with reference to FIG. 5. However, a shape of the touch panel TSP is not limited to the above-described type, but may vary depending on the necessity of the design.

The touch panel TSP senses the touch based on a capacitance formed in the touch electrode. For example, the touch panel TSP employs a capacitance based touch sensing manner so that the touch is sensed by a mutual-capacitance based touch sensing manner or a self-capacitance based touch sensing manner, but the present disclosure is not limited thereto.

The touch panel TSP further includes a touch driver which supplies a touch driving signal to the touch panel TSP and detects a touch sensing signal from the touch panel TSP.

The touch driver determines the presence of the user's touch and a touch position. That is, when the user touches a partial area of the touch panel TSP, the touch driver senses a touch signal to determine whether the user touches the touch panel TSP and a touch position.

Specifically, the touch driver supplies the touch driving signal to each touch panel TSP. The touch driver is applied with a touch sensing signal from the touch panel TSP. The touch driver may sense the touch in the touch panel TSP by the touch sensing signal.

The touch panel TSP includes a plurality of first touch electrode lines TEL1, a plurality of second touch electrode lines TEL2, a metal shielding layer SML, a plurality of touch routing lines TL, and a shielding routing line SL.

The plurality of first touch electrode lines TEL1 and the plurality of second touch electrode lines TEL2 are disposed in an area corresponding to the active area AA of the display panel DISP.

Each of the plurality of first touch electrode lines TEL1 may be disposed in a first direction and each of the plurality of second touch electrode lines TEL2 is disposed in a second direction which is different from the first direction. For example, the first direction is an x-axis direction and the second direction is a y-axis direction and each of the plurality of first touch electrode lines TEL1 is disposed in the x-axis direction and each of the plurality of second touch electrode lines TEL2 is disposed in the y-axis direction, but is not limited thereto. Further, the first direction and the second direction may be perpendicular to each other, but may not be perpendicular. Further, in the present disclosure, a row and a column are relative so that the row and the column may be switched.

Each of the plurality of first touch electrode lines TEL1 and each of the plurality of second touch electrode lines TEL2 may be configured by a plurality of touch electrodes TE. For example, each of the plurality of first touch electrode lines TEL1 may be configured by a plurality of first touch electrodes TE1 which is electrically connected. Each of the plurality of second touch electrode lines TEL2 may be configured by a plurality of second touch electrodes TE2 which is electrically connected.

Each touch electrode TE may have various shapes. For example, each touch electrode disposed on the touch panel TSP may be a plate type electrode metal without an opening. In this case, each touch electrode TE may be a transparent electrode. For example, each touch electrode TE may be configured by a transparent electrode material so that light emitted from a plurality of sub pixels SP disposed there below is upwardly transmitted.

Further, each touch electrode TE is patterned to a mesh type to have a plurality of openings corresponding to one or more sub pixels located there below. A shape of a mesh type touch electrode having a plurality of openings will be described in detail below with reference to FIG. 3.

Each touch electrode TE may be formed of a metal including at least one of titanium (Ti), aluminum (Al), molybdenum (Mo), molytitanium (MoTi), copper (Cu), and tantalum (Ta) or formed of a transparent conductive material such as indium tin oxide (ITO) or indium zinc oxide (IZO), but is not limited thereto.

At this time, the plurality of first touch electrodes TE1 which configures each of the plurality of first touch electrode lines TEL1 may be driving electrodes and the plurality of second touch electrodes TE2 which configures each of the plurality of second touch electrode lines TEL2 may be sensing electrodes. For example, each of the plurality of first touch electrode lines TEL1 may correspond to a driving electrode line and each of the plurality of second touch electrode lines TEL2 may correspond to a sensing electrode line.

In contrast, the plurality of first touch electrodes TE1 which configures each of the plurality of first touch electrode lines TEL1 may be sensing electrodes and the plurality of second touch electrodes TE2 which configures each of the plurality of second touch electrode lines TEL2 may be driving electrodes. For example, each of the plurality of first touch electrode lines TEL1 may correspond to a sensing electrode line and each of the plurality of second touch electrode lines TEL2 may correspond to a driving electrode line.

The plurality of first touch electrode lines TEL1 and the plurality of second touch electrode lines TEL2 are disposed on different layers.

The metal shielding layer SML is disposed in an area corresponding to the active area AA of the display panel DISP. The metal shielding layer SML is disposed below the plurality of first touch electrode lines TEL1 and the plurality of second touch electrode lines TEL2.

The metal shielding layer SML includes a shielding electrode SE. The shielding electrode SE may be a single electrode with a mesh shape or a plurality of electrode patterned to have a mesh shape.

The shielding electrode SE may have a plurality of openings OA corresponding to one or more sub pixels SP located there below. The shape of the shielding electrode with a mesh shape having a plurality of openings will be described in detail below with reference to FIGS. 4A to 4D.

The shielding electrode SE is disposed to be opposite to the plurality of first touch electrode lines TEL1 and the plurality of second touch electrode lines TEL2. To be more specific, the shielding electrode SE is disposed to overlap a touch electrode which configures a more adjacent touch electrode line between the plurality of first touch electrode lines TEL1 and the plurality of second touch electrode lines TEL2. For example, at least a part of the shielding electrode SE may be disposed to overlap the plurality of first touch electrodes TE1 which configures the plurality of first touch electrode lines TEL1 with an insulating layer therebetween.

The metal shielding layer SML may be formed of a metal including at least one of titanium (Ti), aluminum (Al), molybdenum (Mo), molytitanium (MoTi), copper (Cu), and tantalum (Ta) or formed of a transparent conductive material such as indium tin oxide (ITO) or indium zinc oxide (IZO), but is not limited thereto.

The plurality of touch routing lines TL and the shielding routing line SL are disposed in an area of the display panel DISP corresponding to the non-active area NA.

The plurality of touch routing lines TL may include one or more first touch routing lines TL1 connected to each of the plurality of first touch electrode lines TEL1 and one or more second touch routing line TL2 connected to each of the plurality of second touch electrode lines TEL2.

Each of the plurality of first touch routing lines TL is electrically connected to each of the plurality of touch electrodes TE disposed in the active area AA to transmit a signal. For example, a touch driving signal is applied to the first touch electrode line TEL1 by means of the first touch routing line TL1 connected to the first touch electrode line TEL1 and a touch sensing signal is transmitted to the second touch electrode line TEL2 by means of the second touch routing line TL2 connected to the second touch electrode line TEL2.

Such a touch routing line TL may be formed of a low resistance metal material and is also formed of a transparent conductive material such as ITO or IZO, but is not limited thereto. For example, when the plurality of touch routing lines TL is formed of a low resistance metal material, the resistance is lowered to reduce the RC delay.

The shielding routing line SL is connected to the metal shielding layer SML and is configured by at least one wiring line. The shielding routing line SL supplies a uniform voltage to the metal shielding layer SML. For example, the shielding routing line SL supplies a ground voltage to the metal shielding layer SML.

The plurality of touch pads may be disposed in an area corresponding to the non-active area NA of the display panel DISP. One end of the touch pad is connected to the touch routing line TL and the other end is connected to an external circuit, such as a touch driver, to receive the touch signal from the external circuit or transmit the touch sensing signal to the external circuit.

Hereinafter, structures and shapes of a touch electrode and a shielding electrode disposed on a touch panel will be described in more detail with reference to FIGS. 3 and 4A to 4D.

Figure 3:
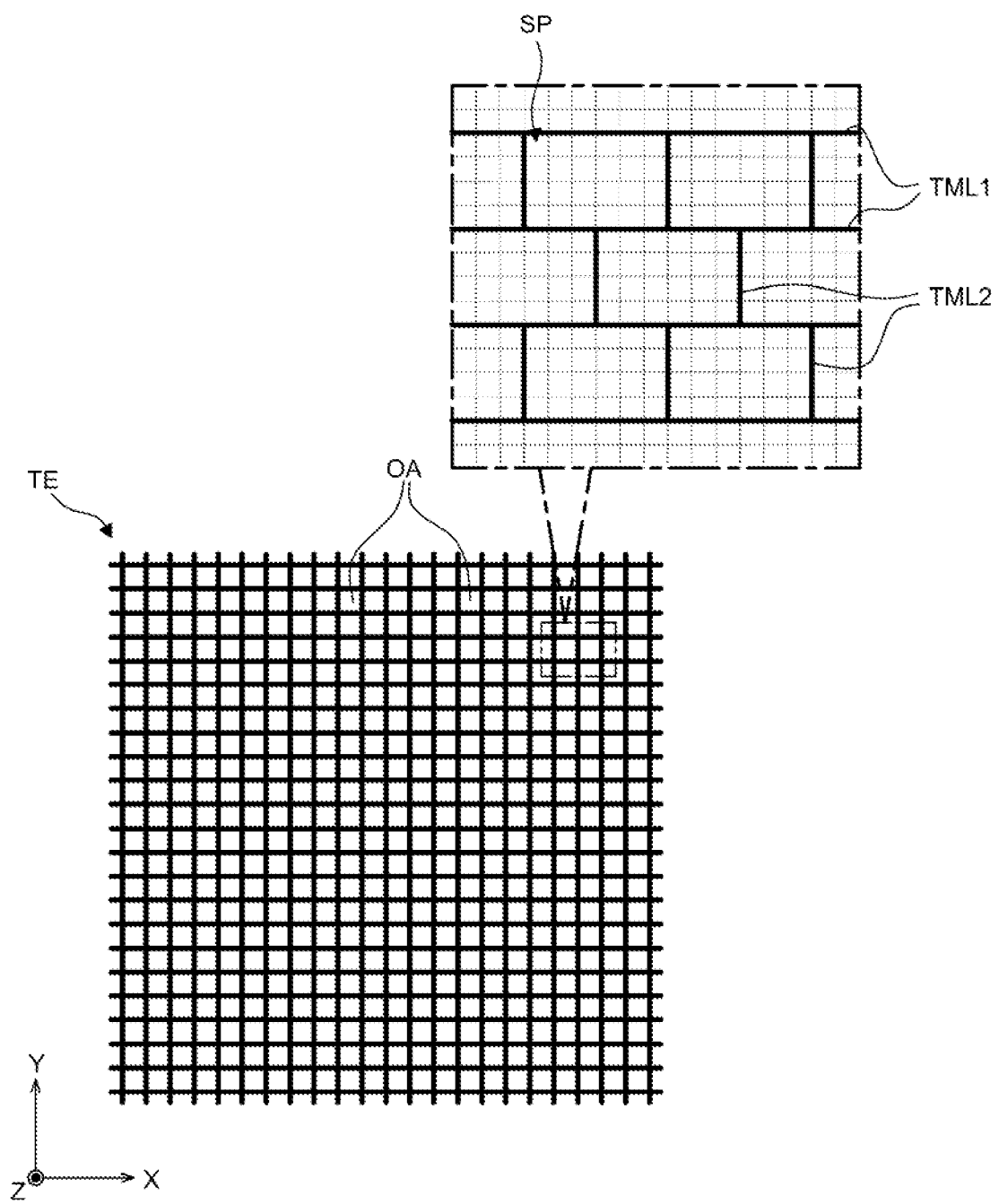
FIG. 3 is a view illustrating a touch electrode disposed on a touch panel illustrated in FIG. 2.

FIG. 3 is a view illustrating a touch electrode disposed on a touch panel illustrated in FIG. 2.

Referring to FIG. 3, each touch electrode TE disposed on the touch panel TSP is patterned to a mesh type to have a plurality of openings OA. Specifically, each touch electrode TE includes a plurality of metal lines. Referring to the enlarged area of FIG. 3, each touch electrode TE is formed of a plurality of first metal lines TML1 extending in the first direction and second metal lines TML2 extending in the second direction. The first metal line TML1 and the second metal line TML2 extend in different directions. The first metal line TML1 extends along a first direction and the second metal line TML2 extends along a second direction which is different from the first direction. For example, the first metal line TML1 extends in the x-axis direction and the second metal line TML2 extends in the y-axis direction. The plurality of first metal lines TML1 and the plurality of second metal lines TML2 are disposed to intersect each other. Further, referring to FIG. 3, the plurality of second metal lines TML2 may be disposed to be shifted from each other in the x-axis direction. Accordingly, each touch electrode TE may have a mesh pattern structure formed by connecting the plurality of first metal lines TML1 and the plurality of second metal lines TML2.

Each of openings OA in each touch electrode TE is formed by being enclosed by two adjacent first metal lines TML1 and two adjacent second metal lines TML2.

Each of the plurality of openings OA may correspond to an emission area of one or more sub pixels SP. For example, the plurality of openings OA may serve as a path on which light emitted from the plurality of sub pixels SP disposed there below passes. By doing this, the first metal line TML1 and the second metal line TML2 which configure each touch electrode TE may be disposed on the bank disposed in the non-emission area, rather than an emission area of the sub pixel SP. Referring to FIG. 3, one opening OA may correspond to a total of 18 (6×3) sub pixels SP. However, the number and the placement of sub pixels SP corresponding to one opening OA may be freely adjusted.

An outline shape of the touch electrode TE may be a quadrangle such as a square shape, a diamond shape or a rhombus or may be various shapes such as a triangle, a pentagon, or a hexagon, as illustrated in FIG. 3.

As a method for forming the plurality of touch electrodes TE, after broadly forming the first metal line TML1 and the second metal line TML2 in a mesh type, the first metal line and the second metal line are cut in a predetermined pattern to be electrically isolated to form the plurality of touch electrodes TE.

FIGS. 4A to 4D are views illustrating a shielding electrode which configures a metal shielding layer disposed on a touch panel illustrated in FIG. 2.

The shielding electrode SE is disposed to overlap a touch electrode which configures a more adjacent touch electrode line, between the plurality of first touch electrode lines TEL1 and the plurality of second touch electrode lines TEL2. For example, at least a part of the shielding electrode SE may be disposed to overlap the plurality of first touch electrodes TE1 which configures the plurality of first touch electrode lines TEL1 with an insulating layer therebetween. Hereinafter, under the assumption that the touch electrode illustrated in FIG. 3 is a first touch electrode which configures the first touch electrode line, a shape of the shielding electrode will be described by comparing with a shape of the touch electrode illustrated in FIG. 3.

Figure 4A:
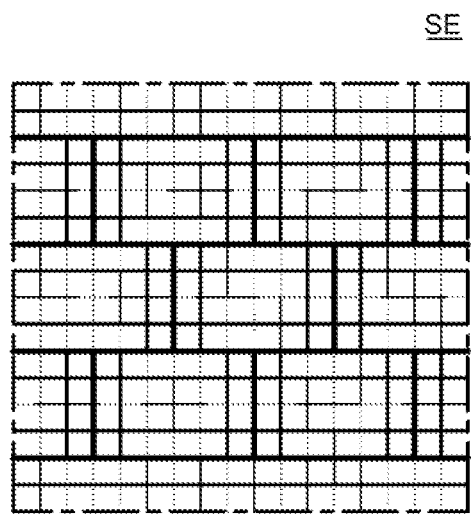
FIGS. 4A to 4D are views illustrating a shielding electrode which configures a metal shielding layer disposed on a touch panel illustrated in FIG. 2.
Figure 4B:
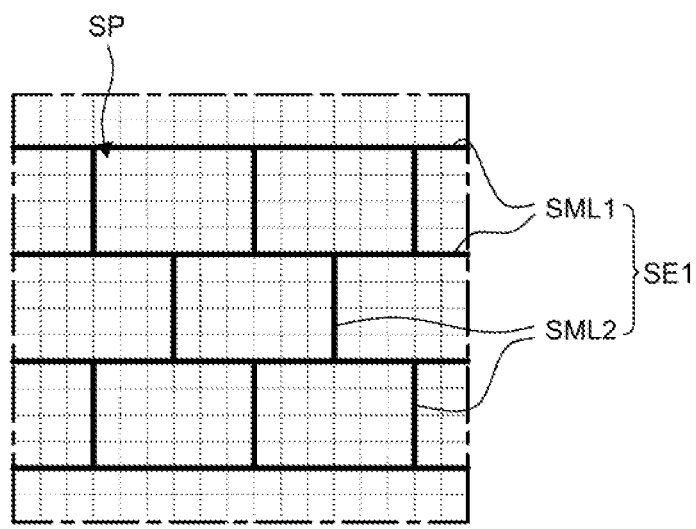
Figure 4C:
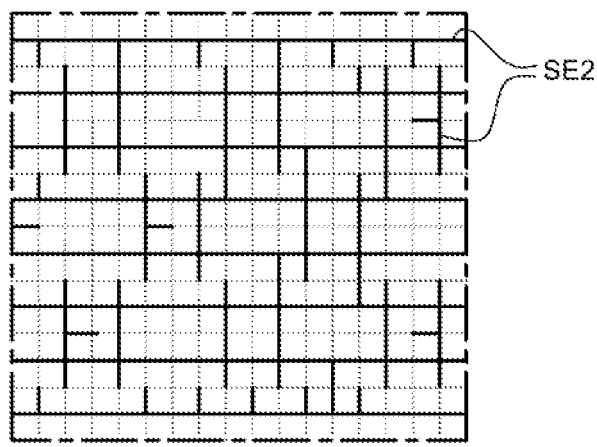
Figure 4D:
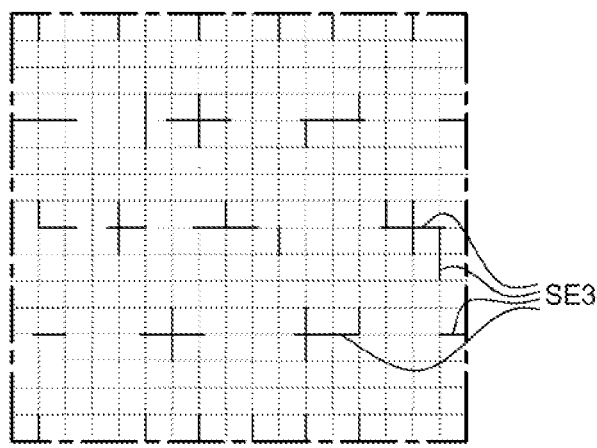

FIG. 4A is a view illustrating a shielding electrode disposed in an area corresponding to the enlarged area of the touch electrode illustrated in FIG. 3. FIG. 4B is a view illustrating a first shielding electrode formed in a first area perpendicularly overlapping the first touch electrode. FIG. 4C is a view illustrating a second shielding electrode formed in a second area which is adjacent to a first shielding electrode by one pixel distance. FIG. 4D is a view illustrating a third shielding electrode which is formed in the third area which is a remaining dummy area excluding the first area and the second area.

As described with reference to FIG. 2, the shielding electrode SE may be a single electrode with a mesh shape or a plurality of electrodes patterned to have a mesh shape. In FIG. 4A, it is assumed that the plurality of shielding electrodes SE is configured to correspond to the shape of the first touch electrode illustrated in FIG. 3.

Referring to FIG. 4A, the shielding electrode SE has a mesh shape and has a plurality of openings OA corresponding to one or more sub pixels located there below. The shielding electrode SE includes a plurality of shielding electrodes. For example, the shielding electrode SE1 includes a first shielding electrode SE1 formed in a first area vertically overlapping the first touch electrode TE1, a second shielding electrode SE2 formed in a second area adjacent to the first touch electrode TE1 with one pixel distance therebetween, and a third shielding electrode SE3 formed in a third area. The third area is a dummy area.

Referring to FIGS. 3 and 4B, an area which vertically overlaps the first touch electrode TE1 illustrated in FIG. 3 is defined as a first area. Accordingly, referring to FIG. 4B, the first shielding electrode SE1 is disposed to overlap the first touch electrode TE1 located there above. To be more specific, the first shielding electrode SE1 includes a plurality of metal lines having the same shape as the first touch electrode TE1. For example, the shielding electrode SE may be configured by a plurality of first shielding metal lines SML1 extending in the first direction and a second shielding metal line SML2 extending in the second direction. The first shielding metal line SML1 extends in the x-axis direction and the second shielding metal line SML2 extends in the y-axis direction. The first shielding metal line SML1 is disposed to overlap the first metal line TMLS1 illustrated in FIG. 3 in a perpendicular direction (z-axis direction) and the second shielding metal line SML2 is disposed to overlap the second metal line TML2 in a perpendicular direction (z-axis direction). The first shielding metal line SML1 and the second shielding metal line SML2 are connected to each other to form a mesh pattern.

Referring to FIG. 4C, a non-emission area adjacent to the first shielding electrode SE1 illustrated in FIG. 3 within one pixel distance is defined as a second area. For example, the second area includes an area which extends from the first shielding metal line SML1 illustrated in FIG. 4B in the y-axis direction by one pixel distance and an area which is spaced apart from the first shielding metal line SML1 by one pixel distance to extend in the x-axis direction. Further, the second area includes an area which extends from the second shielding metal line SML2 illustrated in FIG. 4B in the x-axis direction by one pixel distance and an area which is spaced apart from the second shielding metal line SML2 by one pixel distance to extend in the y-axis direction.

The second shielding electrode SE2 is disposed to be located in the above-described second area. That is, the second shielding electrode SE2 is disposed on a bank layer located within one pixel distance from the first shielding electrode SE1.

At this time, one pixel distance may vary depending on the configuration of the pixel. For example, when one sub pixel is disposed in one pixel, one pixel distance is a size of the sub pixel. Further, when a plurality of sub pixels is disposed in one pixel, one pixel distance may be a size of a unit area including the plurality of sub pixels. For example, one pixel includes three sub pixels and in this case, one pixel distance may be within a size of at least three sub pixels. That is, one pixel distance may be a size of one sub pixel to a size of three sub pixels.

Referring to FIG. 4D, a dummy area other than the first area and the second area is defined as a third area. That is, the third area refers to a non-emission area which is spaced apparat from the first shielding electrode SE1 by more than one pixel distance.

The third shielding electrode SE3 is randomly disposed in the third area. Unlike the first shielding electrode SE1 and the second shielding electrode SE2 which are disposed in both the first area and the second area, the third shielding electrode SE3 may be randomly disposed in the third area which is a dummy area, without a specific shape or rules. At this time, the third shielding electrode SE3 is disposed on a bank layer spaced apart from the first shielding electrode SE1 by more than one pixel distance.

Here, a cross-sectional structure of the active area AA of the display device 100 will be described in more detail with reference to FIG. 5 together.

Figure 5:
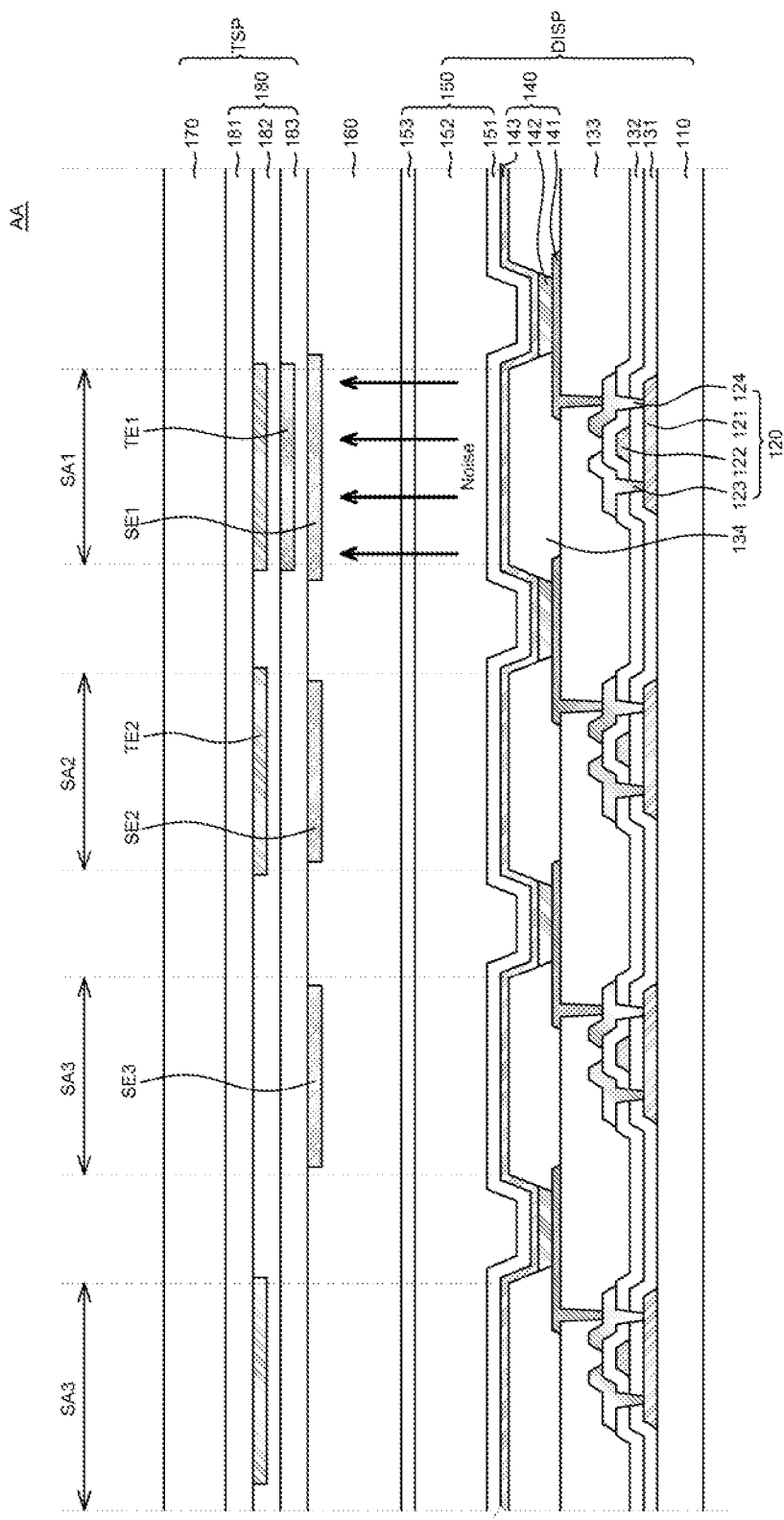
FIG. 5 is a cross-sectional view of a part of an active area of a display device according to an exemplary aspect of the present disclosure.

FIG. 5 is a cross-sectional view of a part of an active area of a display device according to an exemplary aspect of the present disclosure.

Referring to FIG. 5, the display panel DISP includes a lower substrate 110, a thin film transistor 120, a light emitting diode 140, and an encapsulation unit 150.

The lower substrate 110 is a base substrate which supports various components of the display device 100 and may be an insulating substrate. For example, the lower substrate 110 may be configured by glass or plastic. In some exemplary embodiments, the lower substrate 110 may be formed of a material having a flexibility to be bendable if necessary. For example, the lower substrate 110 may be a thin glass base material which satisfies flexibility or may be formed of a polymer material such as polyimide (PI), but is not limited thereto.

A buffer layer may be formed on the lower substrate 110 to protect various components of the display device 100 from permeation of moisture ($H_2O$) and hydrogen ($H_2$) from the outside of the lower substrate 110. However, the buffer layer may be omitted depending on a structure or a characteristic of the display device 100.

An active layer 121 is disposed on the lower substrate 110. The active layer 121 may be formed of polysilicon (p-Si), amorphous silicon (a-Si), or oxide semiconductor, but is not limited thereto.

A gate insulating layer 131 is disposed on the lower substrate 110 and the active layer 121. The gate insulating layer 131 may be formed of silicon oxide SiOx, silicon nitride SiNx, or multiple layers thereof.

A gate electrode 122 is disposed on the gate insulating layer 131. The gate electrode 122 is disposed on the gate insulating layer 131 to overlap the active layer 121. The gate electrode 122 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

An interlayer insulating layer 132 is disposed on the gate insulating layer 131 and the gate electrode 122. The interlayer insulating layer 132 may be formed of silicon oxide SiOx, silicon nitride SiNx, or multiple layers thereof.

A source electrode 123 and a drain electrode 124 are disposed on the interlayer insulating layer 132. The source electrode 123 and the drain electrode 124 are electrically connected to the active layer 132 through the contact holes formed in the gate insulating layer 121 and the interlayer insulating layer 131. The source electrode 123 and the drain electrode 124 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

Even though it is not illustrated, the buffer layer may be located between the lower substrate 110 and the thin film transistor 120, specifically, between the lower substrate 110 and the active layer 121. The buffer layer is a layer for protecting the transistor from impurities such as alkali ions leaked from the lower substrate 110 or layers there below. The buffer layer may be formed of silicon oxide SiOx, silicon nitride SiNx, or multiple layers thereof.

A planarization layer 133 is disposed on the thin film transistor 120. The planarization layer 133 protects the thin film transistor 120 and planarizes an upper portion of the thin film transistor. For example, the planarization layer 133 may be formed of an organic insulating layer, such as benzocyclobutene (BCB) or acryl, but is not limited thereto.

The light emitting diode 140 is disposed on the planarization layer 133. The light emitting diode 140 includes an anode 141, an organic emission layer 142, and a cathode 143.

The anode 141 is formed on the planarization layer 133 to correspond to an emission area of each pixel. The anode 141 is electrically connected to the drain electrode 124 of the thin film transistor 120 by means of a contact hole of the planarization layer 133. The anode 141 may be configured by a metallic material having a high work function. When the display device 100 is a top emission type, the anode 141 may further include a transparent conductive layer and a reflective layer on the transparent conductive layer. The transparent conductive layer may be formed of transparent conductive oxide such as ITO or IZO and the reflective layer is formed of silver (Ag), aluminum (Al), gold (Au), molybdenum (Mo), tungsten (W), chrome (Cr), or an alloy thereof.

A bank layer 134 is formed in a remaining area excluding an emission area. Therefore, the bank layer 134 exposes the anode 141 corresponding to the emission area. The bank layer 134 may be formed of an inorganic insulating material, such as a silicon nitride film (SiNx) or a silicon oxide film (SiOx), or an organic insulating material, such as benzocyclobutene (BCB) based resin, acrylic resin or imide based resin, but is not limited thereto.

Even though it is not illustrated, a spacer may be further formed on the bank layer 134. The spacer may be formed of the same material as the bank layer 134. The spacer may serve to protect a damage of the light emitting diode 140 which may be caused by a fine metal mask (FMM) used to pattern the organic light emitting layer 142.

The organic emission layer 142 is disposed on the anode 141 exposed by the bank layer 134. The organic emission layer 142 includes a hole injection layer, a hole transport layer, an emission layer, an electron transport layer, and an electron injection layer. The organic emission layer 142 may be configured with a single emission layer structure which emits single light or may be configured with a structure which is configured by a plurality of emission layers to emit white light.

The cathode 143 is disposed on the organic emission layer 142. When the light emitting display device 100 is a top emission type, the cathode 143 may be formed of a metal material having a small thickness and a high work function.

The encapsulation unit 150 is disposed on the cathode 143. The encapsulation unit 150 may protect the light emitting diode 140 from the moisture and oxygen. When the light emitting diode 140 is exposed to the moisture or oxygen, the pixel shrinkage phenomenon in which the light emitting diode 140 is shrunk is caused or a dark spot is generated in the emitting emission.

For example, the encapsulation unit 150 includes a first inorganic encapsulation layer 151, an organic encapsulation layer 151 on the first inorganic encapsulation layer 152, and a second inorganic encapsulation layer 152 on the organic encapsulation layer 153. The first inorganic encapsulation layer 151 and the second inorganic encapsulation layer 153 are formed by inorganic insulating layers. For example, the first inorganic encapsulation layer 151 and the second inorganic encapsulation layer 153 may be formed of an inorganic insulating material such as silicon nitride (SiNx), silicon oxide (SiOx), silicon oxynitride (SiON), or aluminum oxide (Al2O3). The organic encapsulation layer 152 is formed as an organic insulating layer. The second inorganic encapsulation layer 153 covers upper surfaces and side surfaces of the first inorganic encapsulation layer 151 and the organic encapsulation layer 152. The second inorganic encapsulation layer 153 minimizes or blocks external moisture or oxygen from permeating the first inorganic encapsulation layer 151 and the organic encapsulation layer 152. At this time, the first inorganic encapsulation layer 151 and the second inorganic encapsulation layer 153 serve to block the permeation of moisture or oxygen and the organic encapsulation layer 152 serves to planarize an upper portion of the first organic encapsulation layer 151. However, a configuration of the encapsulation unit 150 is not limited thereto.

An adhesive layer 160 is disposed on the encapsulation unit 150 to bond the touch panel TSP onto the display panel DISP. Specifically, when the touch panel TSP is separately manufactured from the display panel DISP to be attached onto the display panel DISP in an add-on type, the touch panel TSP and the display panel DISP are bonded by means of an adhesive layer. The adhesive layer 160 is configured by an adhesive material to bond the encapsulation unit 150 and the touch panel TSP. The adhesive layer 160 seals the light emitting diode 140 to protect the light emitting diode 140 from the permeation of the moisture or oxygen from the outside of the display device 100. As the adhesive layer 160, various materials may be used, and for example, various adhesive materials such as optical clear adhesive or optical clear resin may be used.

In the meantime, even though in FIG. 5, an add-on type that the touch panel TSP is bonded onto the display panel DISP by means of the adhesive layer is illustrated, the touch panel TSP may be directly disposed on the encapsulation unit 150 without a separate adhesive layer. For example, an electrode may be directly formed on the encapsulation unit 150. In this case, among the first touch electrode TE1, the second touch electrode TE2, and the shielding electrode SE which configure the touch panel TSP, the shielding electrode SE may be directly disposed on the encapsulation unit 150 without a separate adhesive layer.

The touch panel TSP includes an upper substrate 170, a plurality of insulating layers 180, a first touch electrode TE1, a second touch electrode TE2, and a shielding electrode SE.

The upper substrate 170 is disposed to be opposite to the lower substrate 110 to support various components of the display device 100. The upper substrate 170 is an encapsulation plate and protects the organic light emitting diode of the lower substrate 110 from moisture, air, or physical impacts permeating from the outside. For example, the upper substrate 170 may be disposed by any one of glass, a metal foil, and a plastic film.

The plurality of insulating layers 180 includes a touch buffer layer 181, a touch insulating layer 182, and a touch protection layer 183.

The touch buffer layer 181 suppresses the permeation of moisture or oxygen from the outside to protect the touch electrode TE. The touch buffer layer 181 may minimize a damage which is caused in the upper substrate 170 during a process of forming the touch electrode on a bottom surface. The touch buffer layer 181 may be formed of an inorganic material having an excellent barrier property. Therefore, the permeation of moisture or oxygen may be minimized. For example, the touch buffer layer 181 may be formed of an inorganic material such as silicon nitride SiNx, silicon oxide SiOx, or aluminum oxide AlOx, but is not limited thereto.

A plurality of second touch electrodes TE2 is disposed on the touch buffer layer 181. The plurality of second touch electrodes TE2 may be sensing electrodes or driving electrodes. Referring to FIG. 2, the plurality of second touch electrodes TE2 is disposed in the second direction, that is, the y-axis direction. As illustrated in FIG. 3, each of the plurality of second touch electrodes TE2 is formed of a plurality of first metal lines TML1 and a second metal line TML2 extending in the second direction and may have a mesh pattern structure.

The touch insulating layer 182 is disposed on the bottom surfaces of the touch buffer layer 181 and the second touch electrode TE2. The touch insulating layer 182 insulates the second touch electrode TE2 from the first touch electrode TE1. The touch insulating layer 182 may be formed of an organic insulating material, and for example, formed of an acryl, epoxy, or siloxane based material, but is not limited thereto.

The plurality of touch electrodes TE1 is disposed below the touch insulating layer 182. The plurality of first touch electrodes TE1 may be sensing electrodes or driving electrodes. When the plurality of second touch electrodes TE2 disposed there above is sensing electrodes, the first touch electrode TE1 may be a driving electrode and when the plurality of second touch electrodes TE2 is driving electrodes, the first touch electrode TE1 may be a sensing electrode. Referring to FIG. 2, the plurality of first touch electrodes TE1 is disposed in the first direction, that is, the x-axis direction. As illustrated in FIG. 3, each of the plurality of second touch electrodes TE2 is formed of a plurality of first metal lines TML1 and second metal lines TML2 extending in the second direction and may have a mesh pattern structure. The plurality of first touch electrodes TE1 may have a similar structure to the plurality of second touch electrodes TE2. At this time, the first touch electrode TE1 and the second touch electrode TE2 are disposed to completely overlap each other vertically and may be disposed to be alternately disposed to minimize an overlapping area.

The touch protection layer 183 is disposed on the bottom surfaces of the touch insulating layer 182 and the first touch electrode TE1. The touch protection layer 183 insulates the first touch electrode TE1 from the shielding electrode SE. Further, the touch protection layer 183 minimizes the damage caused in the first touch electrode TE1 during the process of forming the shielding electrode SE on a bottom surface and planarizes a lower portion of the first touch electrode TE1. The touch protection layer 183 may be formed of an organic insulating material, and for example, formed of an acryl, epoxy, or siloxane based material, but is not limited thereto.

The plurality of shielding electrodes SE is disposed below the touch protection layer 183. The shielding electrode SE overlaps the first touch electrode TE1 in a vertical direction with the touch protection layer 183 therebetween. The shielding electrode SE shields the first touch electrode TE1 to reduce a noise affected by the first touch electrode TE1 from the thin film transistor 120.

As mentioned with reference to FIGS. 4A to 4D, the shielding electrode SE1 includes a first shielding electrode SE1 formed in a first area vertically overlapping the first touch electrode TE1, a second shielding electrode SE2 formed in a second area adjacent to the first touch electrode TE1 within one pixel distance, and a third shielding electrode SE3 formed in a third area. The third area is spaced apart from the first shielding electrode SE1 by more than one pixel distance.

Specifically, referring to FIG. 5, the first shielding electrode SE1 is disposed to overlap the first touch electrode TE in the first area SA1 in which the first touch electrode TE1 is located. The first shielding electrode SE1 blocks a noise caused when the first touch electrode TE1 is affected by a voltage generated from the thin film transistor 120. The first touch electrode TE1 is closer to the thin film transistor 120 than the second touch electrode TE2 so that the first touch electrode TE1 is easily affected by a voltage generated in the thin film transistor 120 located there below when the display panel DISP is driven. Accordingly, the first shielding electrode SE1 is disposed below the first touch electrode TE1 to minimize the noise.

A width of the first shielding electrode SE1 may be larger than a width of the first touch electrode located there above. For example, the first shielding electrode SE1 may have a width which is 0.5 μm to 1.6 μm larger than a width of the first touch electrode. As the first shielding electrode SE has a width larger than that of the first touch electrode, a shielding effect to the first touch electrode may be improved.

Referring to FIG. 5, the second shielding electrode SE2 is disposed in the second area SA2 adjacent to the first shielding electrode SE1. The second shielding electrode SE2 is spaced apart from the first shielding electrode SE1 with the emission area of the sub pixel SP therebetween. The second shielding electrode SE2 is disposed in an area in which the first touch electrode is not disposed. Even though in FIG. 5, a structure in which the second shielding electrode SE2 overlaps the second touch electrode TE2 is illustrated, it does not matter if the second touch electrode TE2 is not disposed in the second area SA2.

The second shielding electrode SE2 performs an additional shielding function together with the first shielding electrode SE1. Even though the second shielding electrode SE2 does not overlap the first touch electrode TE1 in the vertical direction, the second shielding electrode may partially shield an interference and a noise generated between the thin film transistor 120 located there below and the adjacent first touch electrode TE1. Further, the second touch electrode TE2, which is relatively far from the thin film transistor 120, is less affected by interference and noise than the first touch electrode TE1. However, the second shielding electrode SE2 is disposed between the second touch electrode TE2 and the thin film transistor 120 so that the second shielding electrode SE2 blocks a noise between the thin film transistor 120 and the second touch electrode TE2.

A width of the second shielding electrode SE2 may be smaller than a width of the first shielding electrode SE1. Further, a width of the second shielding electrode SE2 may be smaller than a width of the first touch electrode TE1. For example, the width of the second touch electrode SE2 may be 1 μm to 2 μm smaller than the width of the first shielding electrode SE1 and may be 0.25 μm to 0.75 μm smaller than the width of the first touch electrode TEL. When a placement position is considered, a shielding effect of the second shielding electrode SE2 is not larger than that of the first shielding electrode SE1 so that when the size of the second shielding electrode SE2 is large, a parasitic capacitance or a noise may be generated between the second shielding electrode SE2 and the thin film transistor. Accordingly, a width of the second shielding electrode SE2 is designed to be smaller than the width of the first shielding electrode SE1 and the first touch electrode TE1 to shield the noise between the touch electrode and the thin film transistor while minimizing the parasitic capacitance.

Referring to FIG. 5, the third shielding electrode SE3 is disposed in the third area SA3 which is a dummy area. The third shielding electrode SE3 is disposed to be spaced apart from the first shielding electrode SE1 by at least two pixels distance. The third shielding electrode SE3 is disposed in an area in which the first touch electrode TE1 is not disposed. Even though in FIG. 5, a structure in which the third shielding electrode SE3 is disposed in an area in which both the first touch electrode TE1 and the second touch electrode TE2 are not disposed is illustrated, the second touch electrode TE2 is also disposed in the third area SA3.

Unlike the first shielding electrode SE1 and the second shielding electrode SE2 which are disposed in the first area SA1 and the second area SA2, respectively, the third shielding electrode SE3 may be randomly disposed in the third area SA3 which is a dummy area, without a specific shape or rules. Referring to FIG. 5, the third shielding electrode SE3 is not disposed in another adjacent third area SA3. To be more specific, referring to FIG. 4C, the third shielding electrode SE3 is randomly disposed in the third area SA3.

The third shielding electrode SE3 serves to reduce a pattern visibility of the shielding electrode SE. Specifically, the first touch electrode TE1 and the second touch electrode TE2 are disposed with a predetermined pattern so that the first touch electrode TE1 and the second touch electrode TE2 also have a predetermined pattern shape in accordance with a pattern shape of the first touch electrode TE1 or the second touch electrode TE2. As described above, when both the touch electrode and the shielding electrode SE have a predetermined pattern shape, the electrode pattern is visibly recognized from the outside, which causes the degradation of the performance and aesthetics of the display device. Accordingly, the third shielding electrode has an irregular pattern shape in the third area which is a dummy area to reduce the visible recognition of the pattern.

The width of the third shielding electrode SE3 may partially vary (e.g., has different widths in different areas). For example, the third shielding electrode SE3 has a width larger than that of the first touch electrode TE1 in a partial area of the third area SA3 and has a width smaller than that of the first touch electrode TE1 in the other area of the third area SA3. The third shielding electrode SE3 has a width which partially varies to maximize the irregularity of the placement of the third shielding electrode SE3 disposed in the third area SA3 to further suppress the visible recognition of the pattern.

In the related art, signals interfere from each other between the thin film transistor disposed on the display panel and the touch electrode disposed on the touch panel to cause a parasitic capacitance and a noise. Accordingly, in the display device according to the exemplary aspect of the present disclosure, the shielding electrode SE is disposed between the touch electrode which is located lower than the other between the sensing electrode and the driving electrode and the thin film transistor. By doing this, the parasitic capacitance and the noise are shielded to improve the touch performance. Further, in the display device according to the exemplary aspect of the present disclosure, the shielding electrode SE is additionally disposed in an area which does not overlap the touch electrode to further improve the shielding effect. Further, in the display device according to the exemplary aspect of the present disclosure, a shielding electrode SE having an irregular shape is further disposed in the dummy area which does not overlap the touch electrode to minimize the visible recognition of the patterns of the electrodes.

Hereinafter, a cross-sectional structure of the non-active area NA of the display device 100 will be described in more detail with reference to FIGS. 6A and 6B.

Figure 6A:
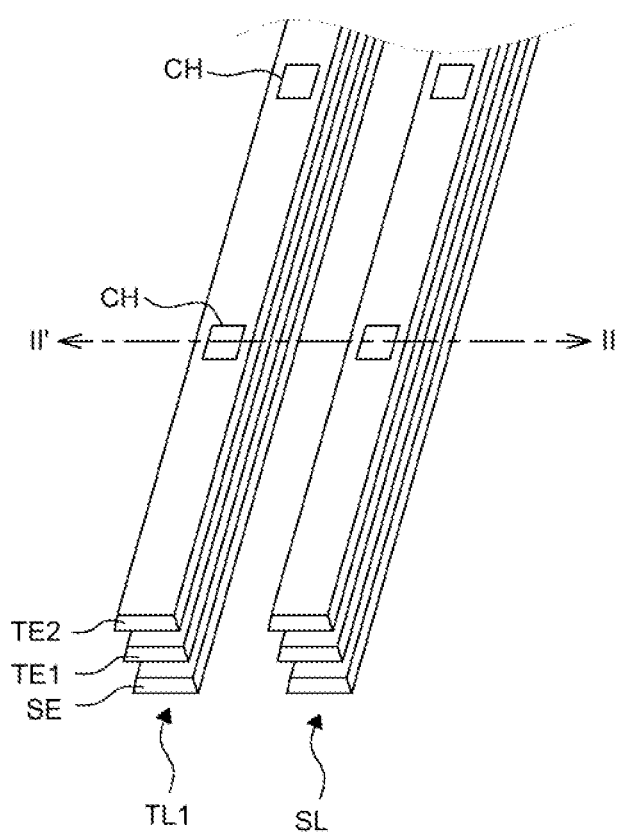
FIG. 6A is a perspective view illustrating a touch routing line and a shielding routing line illustrated in FIG. 2.

FIG. 6A is a perspective view illustrating a touch routing line TL and a shielding routing line SL illustrated in FIG. 2. FIG. 6B is a cross-sectional view taken along II-II' of FIG. 6A.

First, referring to FIG. 2, in the non-active area NA, a plurality of touch routing lines TL which is electrically connected to the plurality of touch electrodes TE disposed in the active area AA and the plurality of shielding routing line SL which is electrically connected to the shielding electrode SE are disposed. The plurality of touch routing lines TL may include one or more first touch routing lines TL1 connected to each of the plurality of first touch electrode lines TEL1 and one or more second touch routing line TL2 connected to each of the plurality of second touch electrode lines TEL2.

Figure 6B:
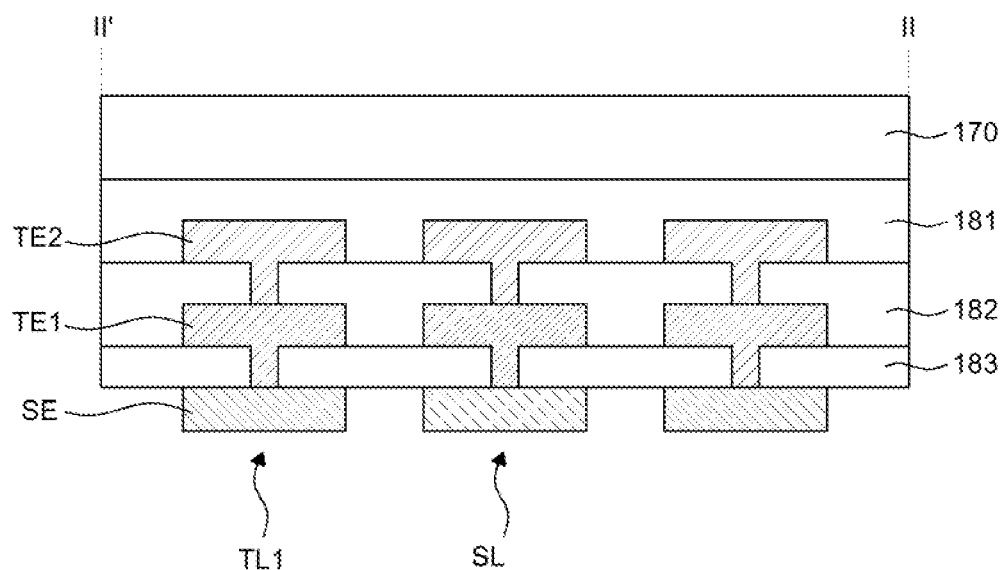
FIG. 6B is a cross-sectional view taken along II-II' of FIG. 6A.

Referring to FIGS. 6A and 6B, all the touch routing lines, for example, the first touch routing line TL1 and the shielding routing line SL may have a triple wiring pattern. Specifically, the first touch routing line TL1 includes a first electrode layer, a second electrode layer, and a third electrode layer. The first electrode layer is an electrode layer which is formed on the same layer with the same material as the shielding electrode SE. The second electrode layer is an electrode layer which is formed on the same layer with the same material as the first touch electrode TE1. The third electrode layer is an electrode layer which is formed on the same layer with the same material as the second touch electrode TE2. The touch protection layer 183 is disposed between the first electrode layer and the second electrode layer, the touch insulating layer 182 is disposed between the second electrode layer and the third electrode layer, and the touch protection layer 183 is disposed between the third electrode layer and the upper substrate 170. At this time, the second electrode layer extends from the first touch electrode TE1 of the active area AA.

The first electrode layer, the second electrode layer, and the third electrode layer are electrically connected through a contact hole CH formed in the insulating layer. Unlike the touch routing line which is simply configured as a single wiring line extending from the touch electrode, a triple wiring line is implemented by electrode layers disposed on the same layers as the first touch electrode TE1, the second touch electrode TE2, and the shielding electrode SE. By doing this, a resistance of the first touch routing line is reduced and a voltage to be transmitted to the plurality of first touch electrodes is increased to perform the stable driving. By doing this, the RC delay may be further reduced.

Similarly, the shielding routing line SL also includes the first electrode layer, the second electrode layer, and the third electrode layer which are electrically connected to each other by means of the contact hole. At this time, the first metal layer extends from the shielding electrode SE of the active area AA.

Figure 7:
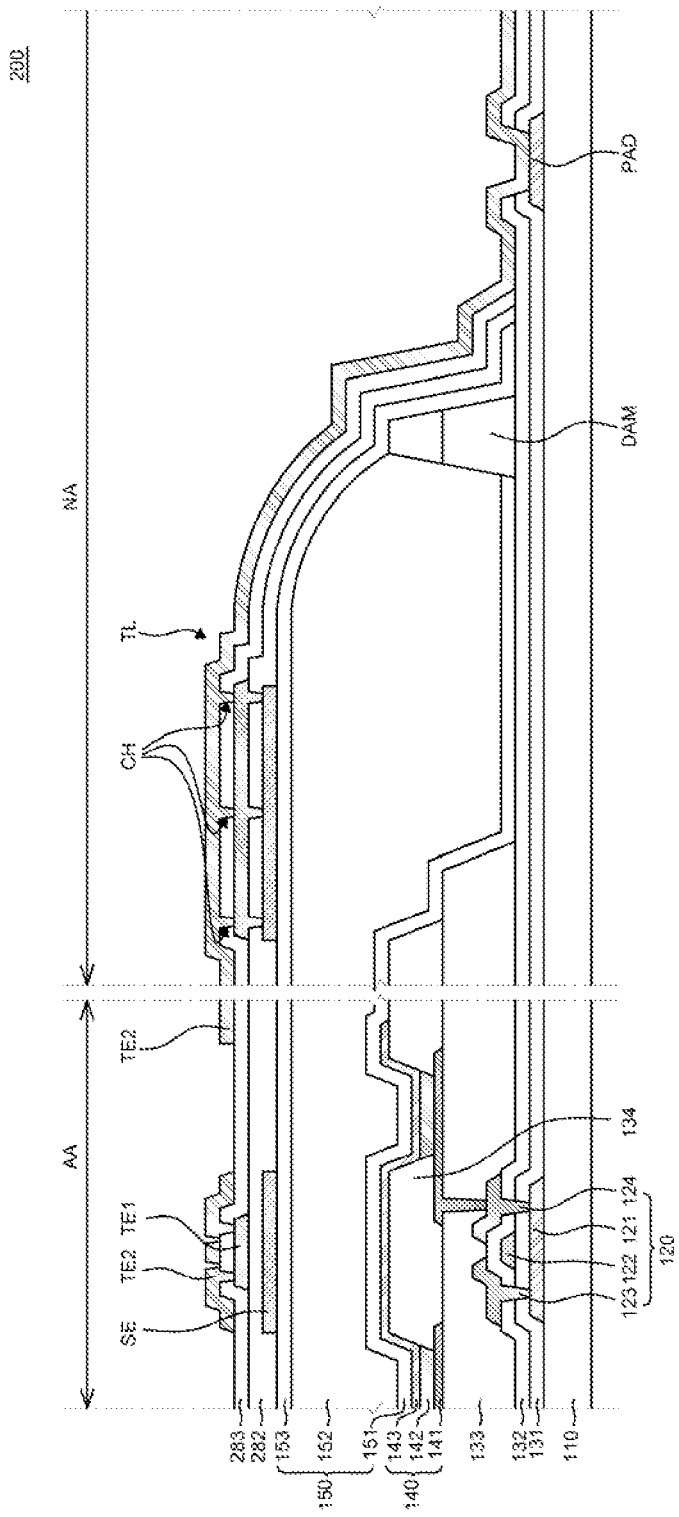
FIG. 7 is a cross-sectional view of a part of an active area of a display device according to another exemplary aspect of the present disclosure.

FIG. 7 is a cross-sectional view of a part of an active area of a display device according to another exemplary aspect of the present disclosure.

A display device according to another exemplary aspect of the present disclosure is an in-cell type organic light emitting display device in which the touch panel is embedded in the display panel. In the display device illustrated in FIG. 7, a placement structure of a first touch electrode, a second touch electrode, and a shielding electrode is different from that of the display device illustrated in FIG. 5 and other configurations are substantially the same so that a redundant description will be omitted.

Unlike the display device illustrated in FIG. 5 in which the adhesive layer 160 and the display panel TSP are sequentially disposed on the display panel DISP, in the display device 200 illustrated in FIG. 7, the shielding electrode is disposed on the encapsulation unit 150 without a separate adhesive layer.

Referring to FIG. 7, the shielding electrode SE is disposed on the encapsulating unit 150. At this time, a touch buffer layer may be additionally disposed between the encapsulation unit 150 and the shielding electrode SE.

The touch insulating layer 282 is disposed on the shielding electrode SE and the first touch electrode TE1 is disposed on the touch insulating layer 282. Further, the touch protection layer 283 is disposed on the first touch electrode TE1 and the second touch electrode TE2 is disposed on the touch protection layer 283.

The display device according to another exemplary aspect of the present disclosure is an in-cell type display device in which the touch panel is embedded in the display panel. When there is no separate adhesive layer between the organic light emitting diode and the touch electrode, a distance between the thin film transistor and the touch electrode is reduced so that a signal interference between the thin film transistor and the touch electrode may be amplified. Accordingly, the shielding electrode SE is disposed below the first touch electrode TEL and the second touch electrode TE2 to reduce the signal interference which may be generated in the touch electrode.

In the meantime, in the non-active area NA, a touch routing line TL, a shielding routing line SL, a dam, and a plurality of touch pads PAD are disposed. The touch routing line TL is disposed on the touch protection layer 283 of the non-active area NA. The touch routing line TL is electrically connected to each of the plurality of touch electrodes TE disposed in the active area AA to transmit a signal. The shielding routing line SL is connected to the metal shielding layer SML to supply a uniform voltage to the metal shielding layer SML. For example, the shielding routing line SL supplies a ground voltage to the metal shielding layer SML.

A dam DAM which blocks the flow of the organic encapsulation layer 152 which configures the encapsulation unit 150 may be disposed in the non-active area NA. Specifically, the dam DAM is disposed in the non-active area NA as a closed curve which encloses the active area AA, the second inorganic encapsulation layer 153 is disposed on the dam DAM, and the flow of the organic encapsulation layer 152 is blocked by the dam DAM. The dam DAM needs to be formed with a predetermined height or higher to block the flow of the organic encapsulation layer 152. To this end, the dam DAM may be formed of at least one or more layers formed of an organic material. For example, the dam DAM may include a lower layer formed of the same material as the planarization layer 133 and an upper layer formed of the same material as the bank layer 134, but is not limited thereto. Even though in FIG. 7, one dam DAM is illustrated, two or more dams DAM may be provided.

In the meantime, one end of the touch pad PAD is connected to the touch routing lines TL and the other end is connected to an external circuit such as a touch driver to receive the touch signal from the external circuit or transmit the touch sensing signal to the external circuit.

Referring to FIG. 7, the touch routing line TL electrically connects each of the plurality of touch electrodes TE disposed in the active area AA and the touch pad PAD of the non-active area NA. At this time, the touch routing line TL may have a triple wiring pattern. Specifically, the touch routing line TL includes a first electrode layer formed on the same layer with the same material as the shielding electrode SE, a second electrode layer formed on the same layer with the same material as the first touch electrode TE1, and a third electrode layer formed on the same layer with the same material as the second touch electrode TE2. The first electrode layer, the second electrode layer, and the third electrode layer are electrically connected through a plurality of contact holes CH formed in the insulating layer.

The touch routing line TL with the triple wiring pattern extends toward the touch pad PAD of the non-active area NA. The touch routing line TL extends to the touch pad PAD beyond the insulating layer disposed above the dam DAM. At this time, the touch routing line TL may be changed from the triple line to a single line before passing the upper portion of the dam DAM. Referring to FIG. 7, in the touch routing line TL, the first electrode layer formed of the same material as the shielding electrode SE and the second electrode layer formed of the same material as the first touch electrode TE1 do not extend from a point where the thickness of the organic encapsulation layer 152 is reduced before being adjacent to the dam DAM. However, only the third electrode layer formed of the same material as the second touch electrode extends to the dam DAM, but the present disclosure is not limited thereto. If necessary, the touch routing line TL may extend toward the upper portion of the dam DAM while maintaining the triple wiring line or extend as a double wiring line.

Referring to FIG. 7, the touch routing line TL with a single wiring pattern which passes above the dam DAM extends toward the touch pad PAD to be in contact with the touch pad PAD.

As illustrated in FIG. 7, the touch routing line TL is not configured as a single wiring line, but implemented as a triple wiring line by electrode layers disposed on the same layers as the first touch electrode TE1, the second touch electrode TE2, and the shielding electrode SE, respectively. By doing this, a resistance of the touch routing line TL is reduced and a voltage to be transmitted to the first touch electrode is increased to reduce the RC delay.

The exemplary embodiments of the present disclosure may also be described as follows:

According to an aspect of the present disclosure, there is provided a display device. The display device includes a lower substrate including a plurality of sub pixels and including an active area and a non-active area which encloses the active area: a thin film transistor disposed on the lower substrate corresponding to one of the plurality of sub pixels: a light emitting diode disposed on the thin film transistor to correspond to the one of the plurality of sub pixels: a plurality of first touch electrodes disposed on the light emitting diode to correspond to the active area: a plurality of second touch electrodes disposed on the plurality of first touch electrodes to correspond to the active area: a first shielding electrode disposed between the light emitting diode and the plurality of first touch electrodes and overlaps the first touch electrode: and a second shielding electrode which is disposed between the light emitting diode and the plurality of first touch electrodes and does not overlap the first touch electrode.

The first shielding electrode and the second shielding electrode vertically may overlap the thin film transistor.

The second shielding electrode may overlap one of the plurality of second touch electrodes.

Each of the plurality of first touch electrodes may have a mesh pattern including a plurality of openings.

Each of the plurality of first touch electrodes may include a plurality of first metal lines extending in a first direction and a plurality of second metal lines extending in a second direction which is different from the first direction, the plurality of first metal lines and the plurality of second metal lines may be connected to each other to form the plurality of openings, each of the plurality of openings corresponds to emission areas of one or more sub pixels, and the plurality of first metal lines and the plurality of second metal lines may correspond to non-emission areas of one or more sub pixels.

The second shielding electrode may be disposed in a non-emission area located within one pixel distance from the first shielding electrode.

The first shielding electrode may include a first shielding metal line and a second shielding metal line disposed to overlap the first metal line and the second metal line and the second shielding electrode may include an area which extends from the first shielding metal line to the second direction by one pixel distance and an area which is spaced apart from the first shielding metal line by one pixel distance to extend in the first direction.

One pixel distance may be a size of one sub pixel to a size of three sub pixels.

The display device may further comprise a third shielding electrode which is disposed in a dummy area which is a non-emission area which does not overlap the first shielding electrode and the second shielding electrode.

The third shielding electrode may be randomly disposed in the dummy area.

A width of the first shielding electrode may be larger than a width of the first touch electrode.

A width of the second shielding electrode may be smaller than a width of the first touch electrode.

The third shielding electrode may have a width which varies.

The display device may further comprise one or more first touch routing lines which are disposed in the non-active area and are connected to each of the plurality of first touch electrode lines: one or more second touch routing lines which are connected to each of the plurality of second touch electrode lines: and one or more shielding routing lines which are connected to the first shielding electrode and the second shielding electrode. The first touch routing line, the second touch routing line, and the shielding routing line may have triple wiring patterns.

Each of the first touch routing line, the second touch routing line, and the shielding routing line may include a first electrode layer formed on the same layer as the first shielding electrode and the second shielding electrode, a second electrode layer formed on the same layer as the first touch electrode, and a third electrode layer formed on the same layer as the second touch electrode, and the first electrode layer, the second electrode layer, and the third electrode layer may be electrically connected to each other through a contact hole formed in an insulating layer.

The first touch routing line and the second touch routing line may be connected to a touch pad disposed in the non-active area and at least one of the first electrode layer, the second electrode layer, and the third electrode layer may be in contact with the touch pad.

The first touch routing line and the second touch routing line may extend toward the touch pad and may be adjacent to the touch pad to include only any one of the first electrode layer, the second electrode layer, and the third electrode layer.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present

What is claimed is:

1. A display device, comprising:
   a lower substrate including a plurality of sub pixels and including an active area and a non-active area which encloses the active area;
   a thin film transistor on the lower substrate corresponding to one of the plurality of sub pixels;
   a light emitting diode on the thin film transistor corresponding to the one of the plurality of sub pixels;
   a plurality of first touch electrodes on the light emitting diode corresponding to the active area;
   a plurality of second touch electrodes on the plurality of first touch electrodes corresponding to the active area;
   a first shielding electrode between the light emitting diode and the plurality of first touch electrodes overlapping a first touch electrode of the plurality of first touch electrodes;
   a second shielding electrode between the light emitting diode and the plurality of first touch electrodes, wherein the second shielding electrode does not overlap the first touch electrode; and,
   a third shielding electrode in a dummy area that does not overlap the first shielding electrode and the second shielding electrode, the dummy area being a non-emission area,
   wherein the third shielding electrode is randomly disposed in the dummy area.

2. The display device according to claim 1, wherein the first shielding electrode and the second shielding electrode vertically overlap the thin film transistor.

3. The display device according to claim 1, wherein the second shielding electrode overlaps one of the plurality of second touch electrodes.

4. The display device according to claim 1, wherein each of the plurality of first touch electrodes has a mesh pattern including a plurality of openings.

5. The display device according to claim 4, wherein each of the plurality of first touch electrodes includes a plurality of first metal lines extending in a first direction and a plurality of second metal lines extending in a second direction which is different from the first direction, the plurality of first metal lines and the plurality of second metal lines are connected to each other to form the plurality of openings, each of the plurality of openings corresponding to emission areas of one or more sub pixels, and the plurality of first metal lines and the plurality of second metal lines correspond to non-emission areas of one or more sub pixels.

6. The display device according to claim 5, wherein the second shielding electrode is disposed in a non-emission area located within one pixel distance from the first shielding electrode.

7. The display device according to claim 6, wherein the first shielding electrode includes a first shielding metal line and a second shielding metal line disposed so as to overlap the first metal line and the second metal line, and
   the second shielding electrode includes:
   an area which extends from the first shielding metal line to the second direction by one pixel distance, and
   an area which is spaced apart from the first shielding metal line by one pixel distance to extend in the first direction.

8. The display device according to claim 6, wherein the one pixel distance is a size of one sub pixel to a size of three sub pixels.

9. The display device according to claim 1, wherein a width of the first shielding electrode is larger than a width of the first touch electrode.

10. The display device according to claim 1, wherein a width of the second shielding electrode is smaller than a width of the first touch electrode.

11. The display device according to claim 1, wherein the third shielding electrode has a varying width.

12. The display device according to claim 1, further comprising:
    one or more first touch routing lines in the non-active area connected to each of a plurality of first touch electrode lines;
    one or more second touch routing lines connected to each of a plurality of second touch electrode lines; and
    one or more shielding routing lines connected to the first shielding electrode and the second shielding electrode,
    wherein the first touch routing line, the second touch routing line, and the shielding routing line have triple wiring patterns.

13. The display device according to claim 12, wherein each of the first touch routing line, the second touch routing line, and the shielding routing line includes a first electrode layer formed on the same layer as the first shielding electrode and the second shielding electrode, a second electrode layer formed on the same layer as the first touch electrode, and a third electrode layer formed on the same layer as the second touch electrode, and the first electrode layer, the second electrode layer, and the third electrode layer are electrically connected to each other through a contact hole formed in an insulating layer.

14. The display device according to claim 13, wherein the first touch routing line and the second touch routing line are connected to a touch pad disposed in the non-active area and at least one of the first electrode layer, the second electrode layer, and the third electrode layer is in contact with the touch pad.

15. The display device according to claim 14, wherein the first touch routing line and the second touch routing line extend toward the touch pad and are adjacent to the touch pad to include only any one of the first electrode layer, the second electrode layer, and the third electrode layer.

16. A display device, comprising:
    a substrate including a plurality of sub pixels forming an active area and a non-active area enclosing the active area;
    a thin film transistor on the substrate;
    a light emitting diode on the thin film transistor;
    a plurality of first touch electrodes on the light emitting diode;
    a first shielding electrode overlapping at least one of the plurality of first touch electrodes;
    a second shielding electrode not overlapping the at least one of the plurality of first touch electrodes; and
    a third shielding electrode in a dummy area that does not overlap the first shielding electrode and the second shielding electrode, the dummy area being a non-emission area,
    wherein the third shielding electrode is randomly disposed in the dummy area.

17. The display device of claim 16, further comprising:
    a plurality of second touch electrodes, wherein the second shielding electrode overlaps at least one of the plurality of second touch electrodes.

18. The display device of claim 17, wherein the plurality of first touch electrodes and the plurality of second touch electrodes correspond to the active area.

* * * * *